(12) United States Patent
Bushnell et al.

(10) Patent No.: US 7,810,053 B2
(45) Date of Patent: Oct. 5, 2010

(54) METHOD AND SYSTEM OF DYNAMIC POWER CUTOFF FOR ACTIVE LEAKAGE REDUCTION IN CIRCUITS

(76) Inventors: Michael Bushnell, 16 Sherbrooke Dr., Princeton Junction, NJ (US) 08550; Baozhen Yu, 23942 BPO Way, Piscataway, NJ (US) 08854

( * ) Notice: Subject to any disclaimer, the term of this patent is extended or adjusted under 35 U.S.C. 154(b) by 234 days.

(21) Appl. No.: 11/906,876

(22) Filed: Oct. 4, 2007

(65) Prior Publication Data
US 2008/0141185 A1    Jun. 12, 2008

Related U.S. Application Data

(60) Provisional application No. 60/849,539, filed on Oct. 4, 2006.

(51) Int. Cl.
*G06F 17/50* (2006.01)
(52) U.S. Cl. .................. 716/2; 716/1; 716/4; 716/5; 716/7
(58) Field of Classification Search .............. 716/1, 716/2, 4, 5, 7
See application file for complete search history.

(56) References Cited

U.S. PATENT DOCUMENTS 5,983,007 A   11/1999   Agrawal
7,454,738 B2  11/2008   Banerjee et al.
7,665,047 B2   2/2010   Orshansky et al.

2004/0060022 A1 * 3/2004 Allen et al. .................. 716/6

OTHER PUBLICATIONS

Yu et al., "A Novel Dynamic Power Cutoff Technique (DPCT) for Active Leakage Reduction in Deep Submicron CMOS Circuits," IEEE, Oct. 4-6, 2006, pp. 214-219.*
Bhunia et al., "A Novel Synthesis Approach for Active Leakage Power Reduction Using Dynamic Supply Gating", Proc. of the Design Automation Conf. 479-484 (2005).
Burd et al., "A Dynamic Voltage Scaled Microprocessor System", IEEE Journal of Solid-State Circuits, 35 (11):1571-1580 (2000).

(Continued)

*Primary Examiner*—Vuthe Siek
(74) *Attorney, Agent, or Firm*—Porzio, Bromberg & Newman

(57) ABSTRACT

The present invention relates to a novel active leakage power reduction technique, referred to as the dynamic power cutoff technique (DPCT). The DPCT method of the present invention can reduce active leakage, standby leakage, and dynamic power by applying the dynamic power cutoff technique to a circuit. In the method and system for dynamic power cutoff for active leakage reduction in circuits of the present invention, a switching window is determined for each gate, during which a gate makes its transitions. For example, the switching window can be determined by static timing analysis. Then, the circuit is optimally partitioned into different groups based on the minimal switching window (MSW) of each gate. Finally, power cutoff transistors are inserted into each group to control the power connections of that group. Each group is turned on only long enough for a wavefront of changing signals to propagate through that group. Since each gate is only turned on during a small timing window within each clock cycle, this significantly reduces active leakage power.

22 Claims, 6 Drawing Sheets

OTHER PUBLICATIONS

Cao et al., "New Paradigm of Predictive MOSFET and Interconnect Modeling for Early Circuit Simulation", IEEE Custom Integrated Circuits Conf. 201-204 (2000).

Chen et al., "0.18um Dual Vt. MOFET Process and Energy-Delay Measurement", Proc. of the 1996 Int'l, Electron Devices Meeting 851-854 (1996).

Halter et al., "A Gate-Level Leakage Power Reduction Method for Ultra-Low-Power CMOS Circuits", IEEE 1997 Custom Integrated Circuits Conf. 475-478 (1997).

Johnson et al., "Leakage Control with Efficient use of Transistor Stacks in Single Threshold CMOS", Proc. Design Automation Conf. 442-445 (1999).

Kawaguchi et al., "A Super Cut-Off CMOS (SCCMOS) Scheme for 0.5-V Supply Voltage with Picoampere Stand-By Current", IEEE J Solid-State Circuits 35(10):1498-1501 (2000).

Raja et al., "CMOS Circuit Design for Minimum Dynamic Power of Highest Speed", Proc. Int'l. Conf. on VLSI Design 1035-1040 (2004).

Takahashi et al., "A 60-mW MPEG4 Video Codec Using Clustered Voltage Scaling with Variable Supply-Voltage Scheme", IEEE J Solid-State Circuits 33(11):1772-1780 (1998).

Wei et al., "Design and Optimization of Low Voltage High Performance Dual Thershold CMOS Circuits", Proc. Design Automation Conf., 489-494 (1998).

* cited by examiner

METHOD AND SYSTEM OF DYNAMIC POWER CUTOFF FOR ACTIVE LEAKAGE REDUCTION IN CIRCUITS

CROSS REFERENCE TO RELATED APPLICATION

This application claims the benefit of U.S. Provisional Patent Application No. 60/849,539, filed Oct. 4, 2006, the entirety of which is hereby incorporated by reference into this application.

BACKGROUND OF THE INVENTION

1. Field of the Invention

The present invention relates to reducing active leakage power in computer hardware and in particular to a method and system for active leakage power reduction in circuits using a dynamic power cutoff technique.

2. Description of Related Art

Leakage power is increasingly significant in CMOS circuits due to the exponential increase of subthreshold and gate leakage currents from technology scaling. Leakage power is becoming a major fraction of total VLSI chip power in active mode. Conventional leakage reduction techniques have been proposed. A forced stacking method reduces leakage power by inserting an extra serially connected transistor in the gate pulldown or pullup path and turning it off in standby mode, as described in M. Johnson, D. Somasekhar, and K. Roy, "Leakage Control with Efficient Use of Transistor Stacks in Single Threshold CMOS," in Proc. of the Design Auto. Conf, pp. 442-445, June 1999. Input vector control uses the state dependence of leakage to apply a low leakage input vector to the circuit in standby mode to save leakage power, as described in J. Halter and F. Najm, "A Gate-Level Leakage Power Reduction Method for Ultra Low Power CMOS Circuits," in Proc. of the Custom Integrated Circuits Conf., pp. 475-478, 1997.

A conventional power cutoff technique, also referred to as supply gating, reduces leakage by disconnecting the global supply voltage in standby mode, as described in H. Kawaguchi, K. Nose, and T. Sakurai, "A Super Cutoff CMOS (SCCMOS) Scheme for 0.5-V Supply Voltage with Picoampere Stand-By Current," IEEE J. of Solid State Circuits, vol. 35, pp. 1498-1501, October 2000. It inserts low $V_t$ MOSFETs between the power connection of each logic gate and the global power line. Either pMOS or nMOS insertion is used to turn off either $V_{DD}$ or GND of the circuit during idle mode to save leakage power. FIG. 1 illustrates prior art pMOS system 10. When the pMOS cutoff transistor 12 is turned off, the subthreshold leakage reduces dramatically due to the stacking effect. Overall gate leakage also reduces because of a smaller voltage drop across gate oxides of transistors due to the dropped virtual $V_{DD}$. Overall leakage power is dominated by subthreshold and gate leakages, so power cutoff is effective to reduce the deep submicron leakage power. One limitation is that data can be lost during the long sleep period due to the collapsed virtual $V_{DD}$ signal. The power cutoff transistors have about ~6% extra delay in 0.3 µm CMOS, as described in M. Takahashi et al., "A 60-mw MPEG4 Video CODEC Using Clustered Voltage Scaling with Variable Supply-voltage Scheme," IEEE J. of Solid-State Circuits, vol. 33, pp. 1772-1780, November 1998 and 3%-6% delay in 70 nm CMOS, as described in S. Bhunia, N. Banerjee, Q. Chen, H. Mahmoodi, and K. Roy, "A Novel Synthesis Approach for Active Leakage Power Reduction Using Dynamic Supply Gating," in Proc. of the Design Auto. Conf., pp. 479-484, June 2005. They also add chip area. One common shortcoming of the above-described techniques is that they can only reduce the circuit leakage power in standby mode.

Leakage is important in both standby and active operation modes. The leakage in active mode is significantly larger due to the higher die temperature in active mode. Accordingly, efficient leakage power reduction must target both standby and active leakage power. A dual $V_{th}$ technique has been proposed which uses high-threshold voltage devices on non-critical paths to reduce leakage while using low-threshold devices on critical paths to maintain circuit speed as described in Z. Chen, C. Diaz, J. Plummer, M. Cao, and W. Greene, "0.18 µm Dual $V_t$ MOSFET Process and Energy-Delay Measurement," in Proc. of the 1996 Int'l. Electron Devices Meeting, pp. 851-854, December 1996 and L. Wei, Z. Chen, M. Johnson, K. Roy, and V. De, "Design and Optimization of Low Voltage High Performance Dual Threshold CMOS Circuits," in Proc. of the Design Auto. Conf., pp. 489-494, June 1998. It reduces both active and standby leakage. However, this technique does not reduce the leakage on critical paths. Thus, it is it not advantageous for practical circuits, whose paths are usually well balanced. Supply voltage scaling, developed for switching power reduction, also reduces both active and standby leakage power, as described in M. Takahashi et al., "A 60-mw MPEG4 Video CODEC Using Clustered Voltage Scaling with Variable Supply-voltage Scheme," IEEE J. of Solid-State Circuits, vol. 33, pp. 1772-1780, November 1998 and T. D. Burd, T. A. Pering, A. J. Stratakos, and R. W. Brodersen, "A Dynamic Voltage Scaled Microprocessor System," IEEE J. of Solid-State Circuits, vol. 35, pp. 1571-1580, November 2000. This technique has the shortcoming that level conversion is needed at the interface whenever an output from a low $V_{DD}$ unit drives a high $V_{DD}$ unit input. Another conventional approach proposed dynamic leakage reduction using supply gating, as described in S. Bhunia, N. Banerjee, Q. Chen, H. Mahmoodi, and K. Roy, "A Novel Synthesis Approach for Active Leakage Power Reduction Using Dynamic Supply Gating," in Proc. of the Design Auto. Conf., pp. 479-484, June 2005. This technique uses the Shannon expansion to identify the idle circuit parts and dynamically gate the supply to those parts to save active leakage power.

It is desirable to provide an improved active leakage power reduction method which targets the idle part of the circuit when it is in active mode.

SUMMARY OF THE INVENTION

The present invention relates to a novel active leakage power reduction technique, referred to as the dynamic power cutoff technique (DPCT). The DPCT method of the present invention can reduce active leakage, standby leakage, and dynamic power by applying the dynamic power cutoff technique to a circuit.

In the method and system for dynamic power cutoff for active leakage reduction in circuits of the present invention, a switching window is determined for each gate, during which a gate makes its transitions. For example, the switching window can be determined by static timing analysis. Then, the circuit is optimally partitioned into different groups based on the minimal switching window (MSW) of each gate. Finally, power cutoff transistors are inserted into each group to control the power connections of that group. Each group is turned on only long enough for a wavefront of changing signals to propagate through that group. Since each gate is only turned on during a small timing window within each clock cycle, this significantly reduces active leakage power.

Instead of finding the idle circuit part by conventional Shannon expansion, the present invention identifies when a gate is idle from its switching window, the timing window during which the gate makes its transition within each clock cycle. Active leakage power is saved by turning on the power connections of each gate only within its switching window during each clock cycle. Standby leakage can also be reduced by turning off the power connections of all gates all of the time once the circuit is idle. The technique of the present invention also reduces dynamic power by reducing the circuit glitches. Results on ISCAS '85 benchmark circuits modeled using 70 nm Berkeley Predictive Models [1] show up to 90% active leakage, 99% standby leakage, 54% dynamic power, and 72% total power savings.

The invention will be more fully described by reference to the following drawings.

DETAILED DESCRIPTION

Figure 1:
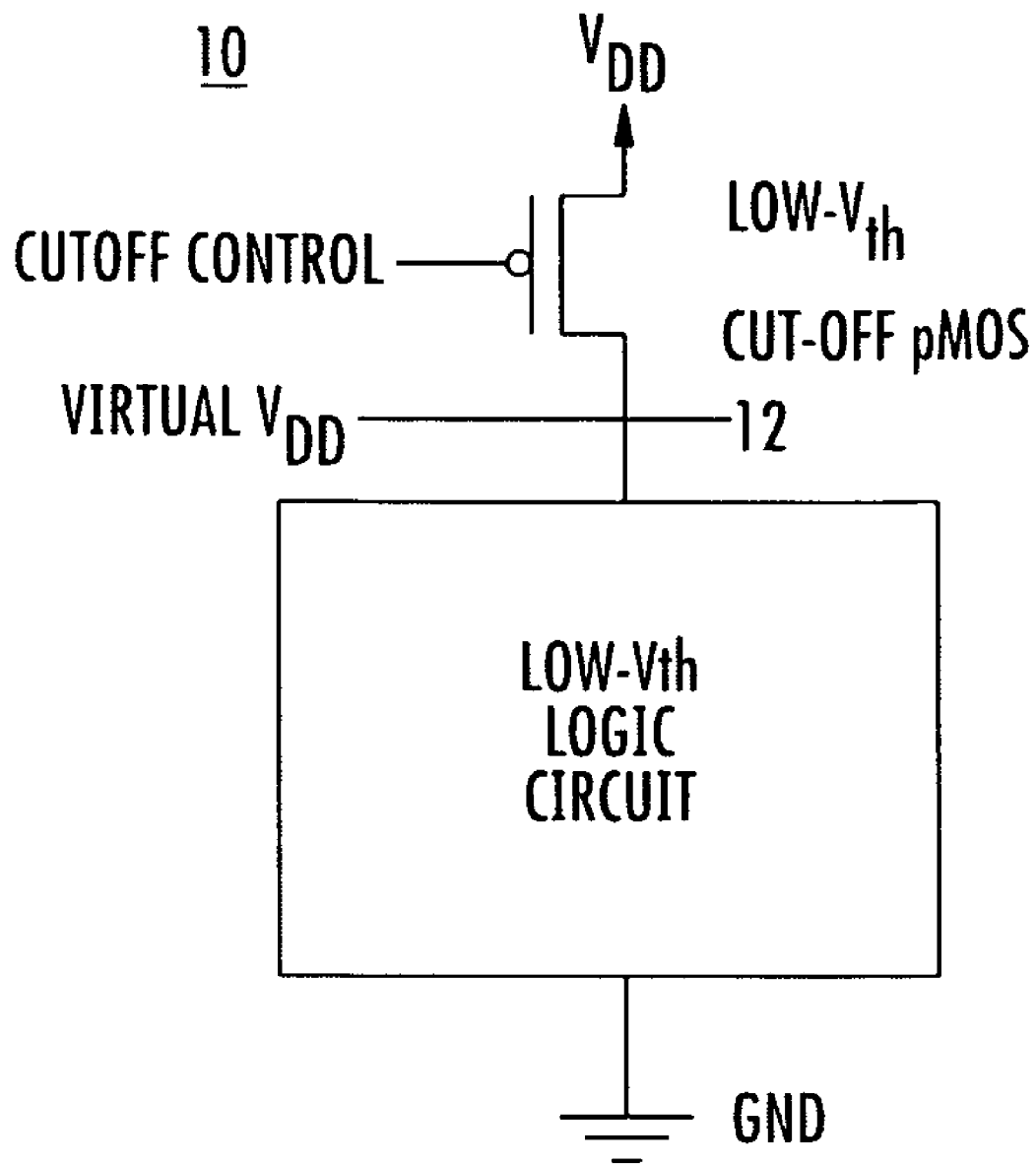
FIG. 1 is a schematic diagram of prior art pMOS insertion for power cutoff system.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 2:
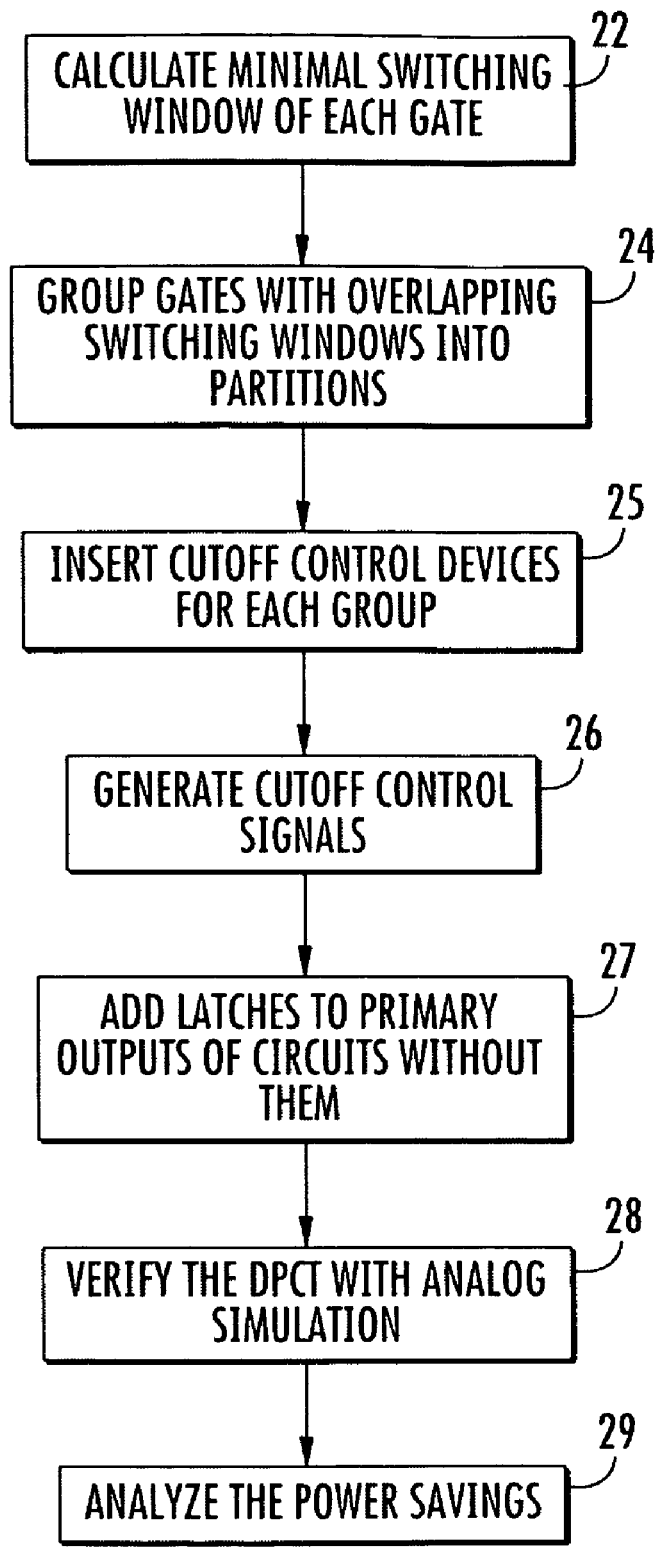
FIG. 2 is a flow diagram of a method for dynamic power cutoff for active leakage reduction in circuits in accordance with the teachings of the present invention.

FIG. 2 is a flow diagram of a method for dynamic power cutoff for active leakage reduction in a circuit 20 in accordance with the teachings of the present invention. In block 22, a minimal switching window (MSW) for each gate is identified. In one embodiment, static timing analysis can be used to determine the minimal switching window (MSW).

Figure 3:
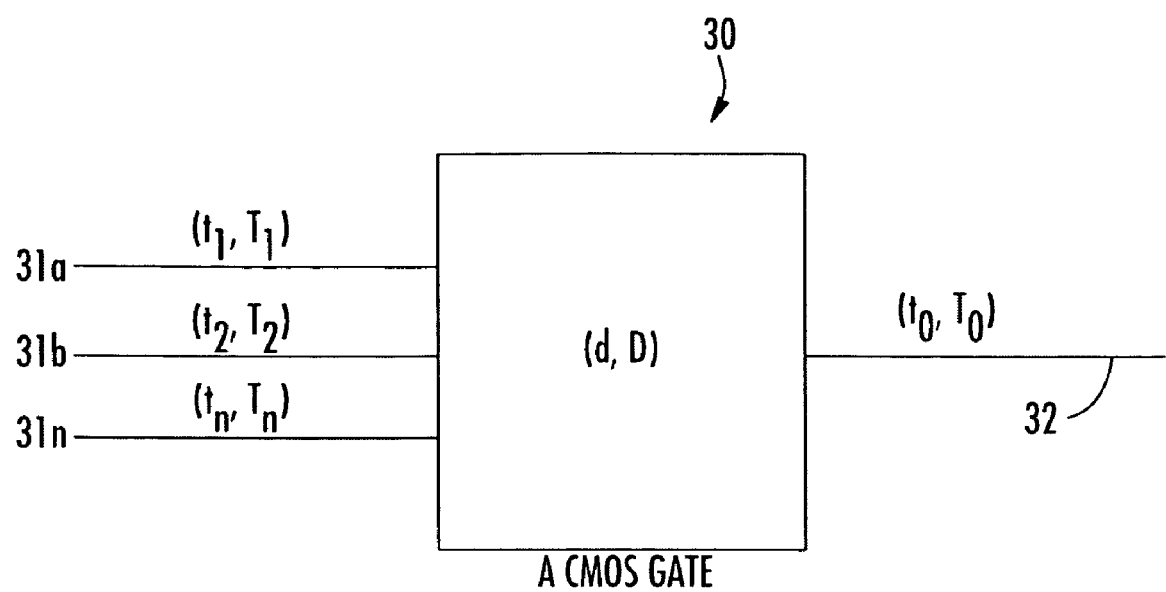
FIG. 3 is a schematic diagram of a timing window of a CMOS gate.

The switching window and minimal switching window (MSW) of a gate are based on a timing window, as shown in FIG. 3. The timing window can be conventional as described in T. Raja, V. Agrawal, and M. Bushnell, "CMOS Circuit Design for Minimum Dynamic Power and Highest Speed," in Proc. of the 17th Int'l. Conf on VLSI Design, pp. 1035-1040, January 2004, hereby incorporated by reference into this application. The timing window (t, T) for each circuit node is specified by two variables t and T. Here, t is the earliest time and T is the most delayed time of signal transition. CMOS gate 30 has n inputs, best-case delay d and worst-case delay D. Each input 31a-31n has a timing window $(t_i, T_i)$, and output 32 has a timing window $(t_o, T_o)$. Then, the output node timing window is derived from the input timing windows and the gate delay according to:

$$T_o = \max(T_i + D), t_o = \min(t_i + d) \quad (1)$$

Using Equation 1, the timing window is calculated for all circuit nodes by a level-order traversal from primary inputs (PIs) to primary outputs (POs), if the delay of each gate and the timing window of each primary input (PI) is known. The maximum $T_o$ of all primary outputs POs is the worst-case delay of the circuit. In a typical circuit, the clock cycle is determined by the worst-case circuit delay. A 10% to 15% margin can be added to make certain that the circuit can always finish its transitions even under the worst case circuit delay.

Based on the timing window method discussed above, the switching window of a gate can be defined as $(\min(t_i), T_o)$, where $\min(t_i)$ is the earliest arrival time among all inputs, and $T_o$ is the latest arrival of the signal at the output of the gate. The switching window of a gate defines a timing window from the earliest arrival time of its inputs to the end time of the latest possible transition the gate can make. The switching window is the timing window during which the gate makes its transition within each clock cycle, when the circuit is in the active mode. A logic gate is in active mode only within its switching window during each clock cycle.

If the power of each gate is turned on only within its switching window during each clock cycle, a part of active leakage power can be saved without affecting its normal transition activity except for a little added delay. The percentage of active leakage power saving of a CMOS gate, $PS_{gate}$, is given by:

$$PS_{gate} = a \times t_{off}/T_{cycle} \quad (2)$$

where $T_{cycle}$ is the clock cycle period, $t_{off}$ is the power-off time of that gate within each clock cycle, and $0 < a < 1$ is an efficiency factor proportional to $t_{off}/T_{cycle}$. It was found that noticeable leakage savings occurred when $t_{off}/T_{cycle} > 1/3$. This is because the virtual $V_{DD}$ and GND take a little extra time to collapse after the cutoff transistors is turned off. Also, it takes some extra cost to operate the cutoff transistors.

The switching window of a gate can become much wider if the gate has very unbalanced minimal and maximal delays, or if its inputs come from different paths with big delay differences, or if some inputs already have wide switching windows. The wide switching windows of the gates make the switching windows of their fanout gates even wider. The result is that the widths of many gates' switching windows are almost as big as the worst-case delay of the circuit. If the power of each gate is turned on within its switching window in each clock cycle, it was found that not much leakage power can be saved.

To solve the problem of the switching window, another type of timing window, referred to as the minimal switching window (MSW) is used in the present invention. The minimal switching window (MSW) is defined as the minimal timing window during which the gate can be turned on without affecting the logic function and worst-case circuit delay. It is represented by $((T_o-D), T_o)$, where $T_o$ is the latest arrival of the signal at the output of the gate and D is the maximal delay of the gate. To calculate each gate's minimal switching window (MSW), each gate delay can be calculated. Static timing analysis can be used to calculate $T_o$ of each gate. Thereafter, $((T_o-D), T_o$ is applied to get the minimal switching window (MSW) of each gate. Accordingly, the gates do not have to be turned on as early as the earliest input signal comes. As long as the gate is turned on D time units earlier than $T_o$, the transition of its output happens no later than $T_o$. Because the worst-case delay of the circuit only depends on the latest transition time of each gate, not the earliest transition time, turning on the power of each gate only within its minimal switching window (MSW) during each clock cycle will not affect the function and the timing performance of the circuit. The use of cutoff transistors will introduce some extra delay, but this extra delay always exists no matter which timing window is used.

The advantage of the minimal switching window (MSW) is that its width only depends on the maximal delay of the gate itself, which is usually less than 1/10 of the worst-case circuit delay in large circuits. It does not blow up with the unbalanced delay of the gate and the delay differences of its inputs. By turning on each gate only within its minimal switching window (MSW), a large percentage of the active leakage of the circuit can be saved. Accordingly, as the gate is only turned on after all input signals are stabilized, the glitches caused by different input path delays are avoided, thereby providing dynamic power savings.

70 nm CMOS Berkeley Predictive Models and BSIM3v3 models were used for simulation of method 20 of the present invention. Each CMOS gate was modeled as an RC network. The load capacitance C was calculated using the parameters and equations defined in the BSIM3v3 model manual. A lookup table based on SPECTRE™ analog simulation was used to get the equivalent R of the n-tree or p-tree of a CMOS gate based on the gate type, the number of fanins, the number of fanouts, and the transistor sizes to compute the equivalent on-resistance. The delay calculation results from static timing analysis were verified on various benchmark circuits to be within 10% error compared with the results of SPECTRE™ analog simulation. The delay calculation, static timing analysis, and minimal switching window (MSW) calculation can be implemented as C programs.

In one embodiment, to allow for a 10% delay estimation error and ensure that signals make full swings to logic 1 or 0, the minimal switching window (MSW) width can be doubled to $((T_o-D)-0.5\times D, T_o+0.5\times D)$. Experiments were performed with timing windows that were 1.0, 1.5, and 2.0 times the minimal switching window (MSW) width. The 1.0 figure gave output logic errors. The 1.5 and 2.0 values worked correctly on all benchmarks. It is preferred to use the 2.0 value to provide a margin for process variations. In alternate embodiments, the minimal switching window (MSW) can be multiplied by a factor to ensure reliable signals and immunity process variations. This also gives some overlap of the power-on time between each gate with its fanin and fanout gates. This allows some early transitions to happen, which can reduce the potential delay cost of DPCT. The minimal switching window (MSW) width is usually less than 1/10 of the clock period, so doubling it has little effect on the active leakage power savings. Alternatively, the relationship between the timing window tolerance and the width can be statically derived.

Referring to FIG. 2, in block 24, gates with overlapping switching windows are grouped into partitions. The switching window of a combined group is the union of the minimal switching windows of all gates within that group. For example, the switching window for a group combining n MSWs $(ts_i, Te_i)$ will be $(\min(ts_i), \max(Te_i))$, $i=1, \ldots, n$.

One embodiment for grouping switching windows into partitions is a greedy partitioning algorithm based on dynamic programming which optimizes the leakage power saving and the extra cost. The function to be optimized is given by:

$$OPT = pa \times PA - pb \times COST \qquad (3)$$

where PS is the estimated total active leakage power saving percentage under the current partitioning scheme, and COST is the estimated indication of the total area and speed cost under the current partitioning scheme. Here, pa and pb are the weights of PS and COST, respectively. Adjusting the relative values of pa and pb allows a choice whether to optimize for more power savings or for less cost.

The COST is an indication of the area and delay cost of a partitioning scheme that is used for a greedy partitioning algorithm. It is proportional to the number of groups and the switching window width of each group. The COST is defined as:

$$COST = \sum_{k=1}^{N_{groups}} pcost \times Width_k / T_{cycle} \qquad (4)$$

where $N_{groups}$ is the total number of groups under the current partitioning scheme, $Width_k$ is the width of the switching window of group k under the current partitioning scheme, and pcost is the overall cost per group per unit time of switching window. pcost=0.1 was used in experiments to obtain the best match between the prediction from the optimizer and the results from the analog simulator. The simplified COST defined here is not the real area cost or delay cost of DPCT, but it gives equally good results as the exact cost function, with much less computation.

To simplify the leakage power calculation, it is assumed that each gate consumes equal amounts of leakage. The total leakage saving of a partitioning scheme is:

$$PS = \sum_{k=1}^{N_{gates}} a \times (T_{cycle} - Width_k) / T_{cycle} \qquad (5)$$

where $N_{gates}$ is the total number of gates within this circuit, $Width_k$ is the width of the switching window of the group where the gate k belongs under the current partitioning scheme, $T_{cycle}$ is the clock period, and a is a parameter for estimation of leakage power saving. The parameter a is calculated by comparing the estimated active leakage power savings with the simulation results from NanoSim™. It was found that using a=0.73 is a desired empirical value to match the analog simulation results.

Figure 4:
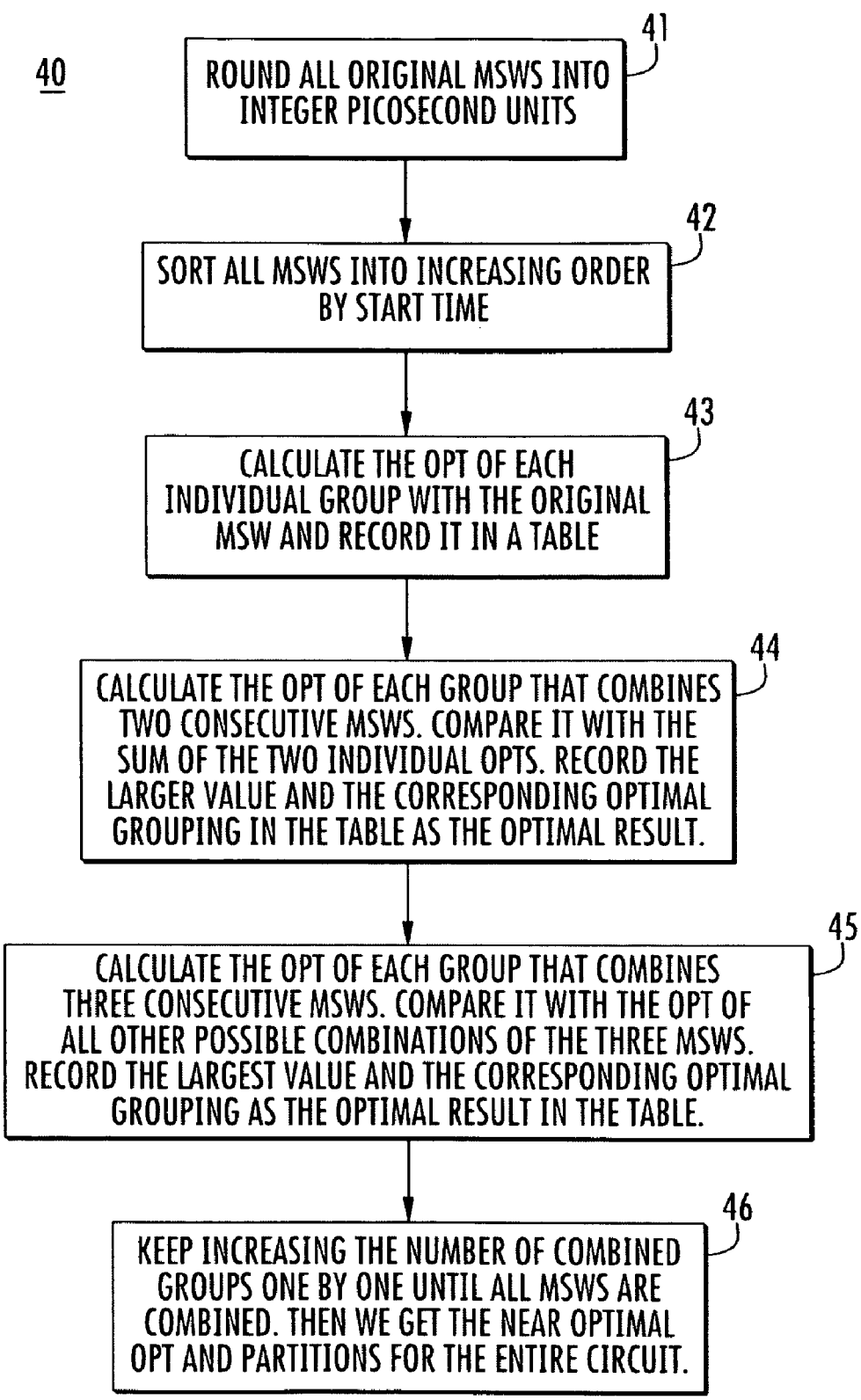
FIG. 4 is a flow diagram of a greedy partitioning algorithm used for grouping gates with overlapping switching windows into partitions.

An implementation of the greedy partitioning algorithm 40 is shown in FIG. 4. In block 41, all original minimal switching windows (MSWs) are rounded into integer units. For example, minimal switching windows (MSWs) can be rounded into integer picosecond units. In block 42, all minimal switching windows (MSWs) are sorted into increasing order by start time. The optimized function (OPT) described above of each individual group is calculated with the original minimal switching window (MSW), in block 43. The determined optimized function (OPT) can be recorded, such as in a table. The optimized function (OPT) of each group that combines two consecutive minimal switching windows (MSWs) is calculated and compared with the sum of the two individual optimized functions (OPTs), in block 44. The larger value and the corresponding optimal grouping is calculated and is recorded in the table as the optimized result. The optimized function (OPT) of each group that combines three consecutive minimal switching windows (MSWs) is calculated and compared with the optimized function (OPT) of all other possible combinations of the three minimal switching windows (MSWs), in block 45. The largest value is recorded and the corresponding optimal grouping as the optimal result in the table. In block 46, the number of combined groups is increased one by one until all minimal switching windows (MSWs) are combined determining the near optimal optimized function (OPT) and partitions for the entire circuit.

Table 1 shows the number of groups, the number of gates per group, the estimated active leakage power saving, and the related cost before and after greedy partitioning for various circuits. Table 1 also shows the number of gates and levels in each circuit. By using the greedy partitioning algorithm, it was found that the average number of groups in a circuit reduces from 484.9 to 18.4 and the average number of gates per group increases from 5.7 to 80.8, while the corresponding average cost reduces from 125.8% to 12.9%. At the same time, the average active leakage power saving only changes from 90.7% to 81.3% after using the greedy partitioning algorithm. Thus, the greedy partitioning algorithm reduces the average cost greatly with little effect on power savings.

gates switching at the same time within this group, which is related to the PI signal activities and the circuit's architecture. In this embodiment, $L_{min}$ is 70 nm. The signal activities of all PIs are set to 0.5. The following empirical equations were experimentally found to set pw, which gives less than 6% delay penalty with less than 15%, average chip area cost.

| pw = 0.02 | if | n > 100, | pw = 0.08 | if | 10 < n ≤ 50 |
| pw = 0.06 | if | 50 < n ≤ 100, | pw = 1/n | if | n ≤ 10 |

Both nMOS and pMOS insertion is used to increase the leakage savings. If the GND cutoff transistor is left out, when a logic gate output is high, the p-tree is on and the n-tree is off. Therefore, a leakage path exists from the high output through the n-tree to GND. Therefore, a leakage path exists from the high output through the n-tree to GND. Similarly, if the $V_{DD}$ cutoff transistor is left off, when a logic gate output is high,

TABLE 1

Greedy Partitioning Results on ISCAS '85 Benchmarks

| Circuit | Number of Gates | Number of Levels | Worst Case Delay (ps) | # of Groups | | Average # Gates per Group | | Estimated Active Leakage Saving (%) | | Estimated Cost (%) | |
|---|---|---|---|---|---|---|---|---|---|---|---|
| | | | | Before Greedy Partitioning | After Greedy Partitioning | Before Greedy Partitioning | After Greedy Partitioning | Before Greedy Partitioning | After Greedy Partitioning | Before Greedy Partitioning | Greedy Partitioning |
| c432 | 160 | 18 | 982 | 41 | 13 | 3.9 | 12.3 | 95.4 | 83.2 | 20.4 | 11.1 |
| c499 | 202 | 12 | 855 | 13 | 10 | 15.5 | 20.2 | 80.8 | 79.6 | 12.4 | 10.7 |
| c880 | 383 | 25 | 819 | 210 | 15 | 1.8 | 25.5 | 88.1 | 74.7 | 86.4 | 14.2 |
| c1355 | 546 | 25 | 830 | 28 | 23 | 19.5 | 23.7 | 89.4 | 88.6 | 13.2 | 11.5 |
| c1908 | 880 | 41 | 1024 | 367 | 17 | 2.4 | 51.8 | 91.4 | 78.7 | 107.6 | 14.2 |
| c2670 | 1193 | 33 | 1467 | 431 | 23 | 2.8 | 51.9 | 92.1 | 83.6 | 98.2 | 13.2 |
| c3540 | 1669 | 48 | 1647 | 747 | 17 | 2.2 | 98.2 | 92.0 | 79.2 | 169.4 | 12.9 |
| c5315 | 2307 | 50 | 1515 | 778 | 14 | 3.0 | 164.8 | 91.1 | 75.7 | 209.9 | 14.2 |
| c6288 | 2416 | 125 | 4547 | 868 | 40 | 2.8 | 60.4 | 94.9 | 89.9 | 97.4 | 12.2 |
| c7552 | 3512 | 44 | 1258 | 1366 | 12 | 2.6 | 292.3 | 92.2 | 80.1 | 442.6 | 15.5 |
| Average | 1105.7 | 35.1 | 1245.3 | 484.9 | 18.4 | 5.7 | 80.8 | 90.7 | 81.3 | 125.8 | 12.9 |

Figure 5:
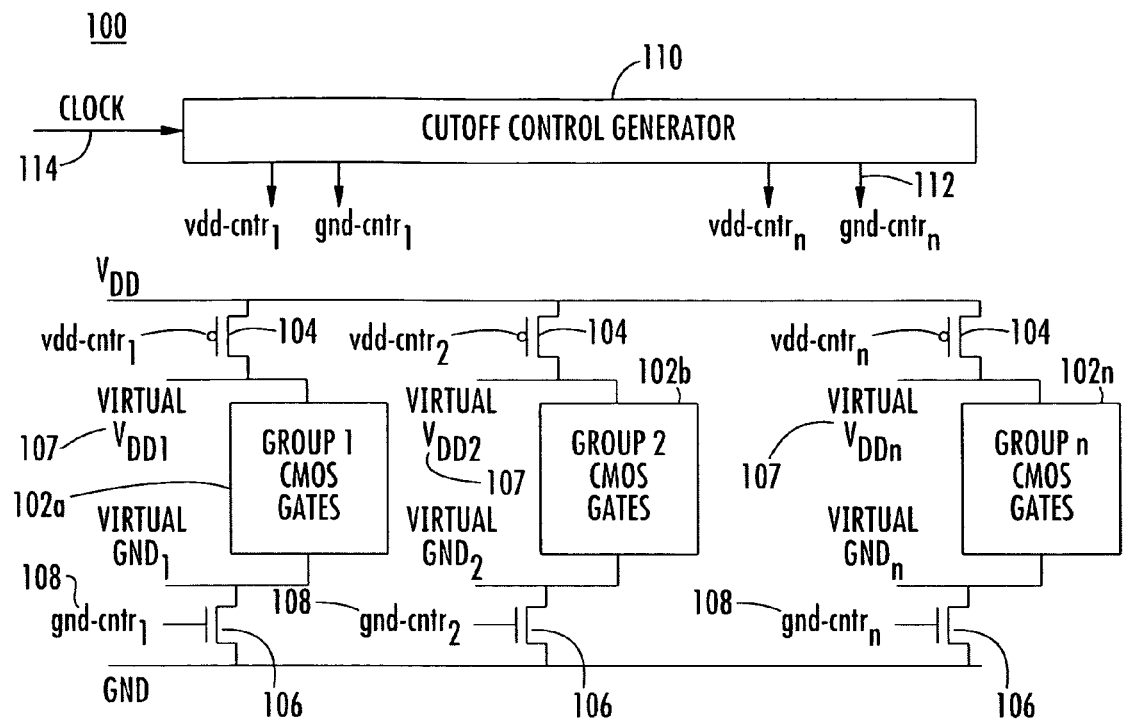
FIG. 5 is a schematic diagram of a system for dynamic power cutoff for active leakage reduction in circuits.

Referring to FIG. 2, in block 25, cutoff control devices are inserted for each determined group. In one embodiment, block 25 is implemented in a system for dynamic power cutoff 100 for active leakage reduction in circuits, as shown in FIG. 5. System 100 includes groups 102a-102n of CMOS gates which were determined in block 24. After greedy circuit partitioning, pMOS transistor 104 and nMOS transistor 106 are inserted into each group 102a-102n to control $V_{DD}$ signals 107 and GND signals 108 of the gates of respective groups 102a-102n. To minimize the extra delay caused by pMOS transistor 104 and nMOS transistor 106 the cutoff MOSFETs are sized appropriately. The delay improvement becomes marginal beyond the size of 10 times for the power cutoff transistor. Also, not all gates switch at the same time within each group. In the present invention, all transistors in the original circuit were used as minimal size. It will be appreciated that alternative types of transistors could be used in accordance with the teachings of the present invention. The widths of the cutoff control pMOS transistor 104 and nMOS transistor 106 are set to:

$$W = pw \times (10 \times L_{min}) \times n \qquad (6)$$

where $L_{min}$ is the minimum feature size in a given process; n is the number of gates within the group controlled by this cutoff MOSFET; and 0<pw<1 is the maximal percentage of the p-tree is on and the n-tree is off. A circuit is partitioned into different groups based on the gate switching windows. Gates with the same switching window are treated as one group 102a-102n and the power connections of all gates within the same group are controlled by one pair of power cutoff MOSFETs, pMOS transistor 104 and nMOS transistor 106. All such different groups make a partition of the circuit. There is one pair of cutoff control signals for each group, vdd-cntr$_i$ and gnd-cnt$_i$, to control $V_{DD}$ and GND of the gates in that group.

Referring to FIG. 2, in block 26, cutoff control signals are generated. Cutoff control signals are used to control the power-on/off of a group based on the switching window of that group. One pair of cutoff control signals is required for each group, one to control nMOS transistor 106 and the other to control pMOS transistor 104. All cutoff control signals have the same period as the global clock signal.

Figure 6:
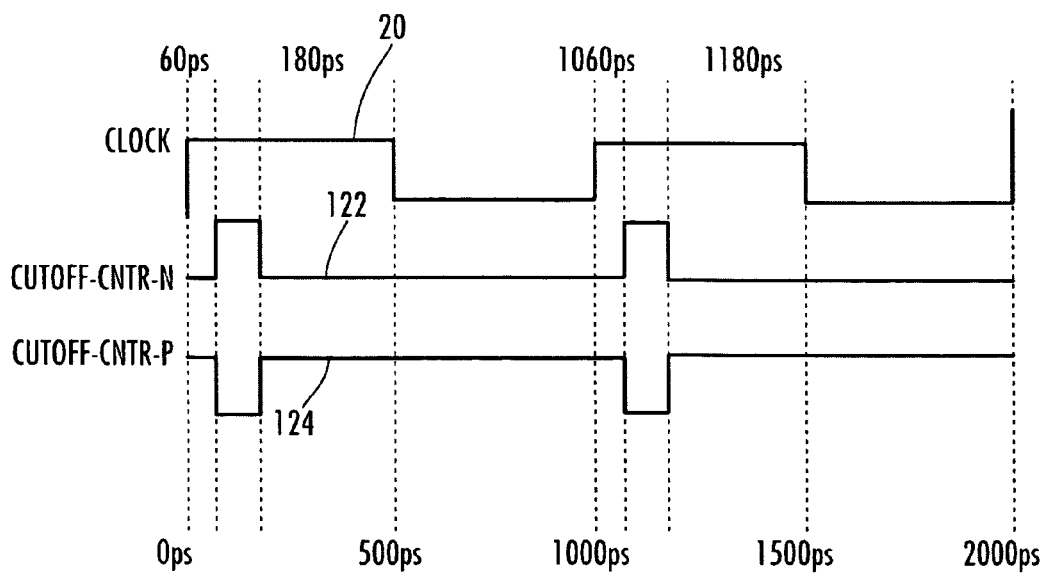
FIG. 6 is a schematic diagram of a clock and waveforms of one pair of cutoff control signals.

Suppose that the clock period is 1 GHz with 50% duty cycle, and the minimum switching window (MSW) of a group (after greedy partitioning) is (60 ps, 180 ps). FIG. 6 shows the waveforms of clock 120 and the two cutoff control signals for this group, cutoff-cntr-n 122 to control the cutoff nMOSFET, and cutoff-cntr-p 124 to control the cutoff pMOSFET.

Figure 7:
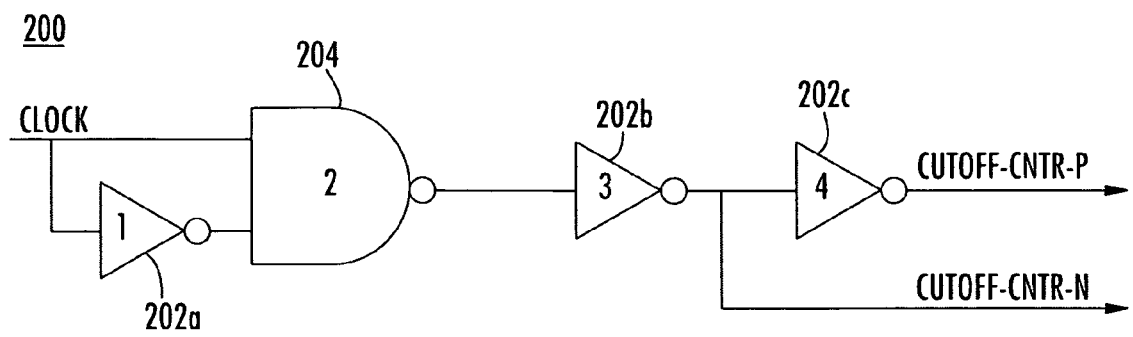
FIG. 7 is a schematic diagram of a clock stretcher for generating cutoff control signals.

In one embodiment, clock stretchers can be used to generate the power cutoff control signals for each group. An example clock stretcher 200 used to generate the cutoff control signals in FIG. 7. Clock stretcher 200 has three inverters 202a-202c and NAND gate 204. The signal cutoff-cntr-n must rise at time offset from the rising clock edge, and remain high for time width, so that its partition is powered at the correct time, relative to clock, so that the wavefront of signals passes through it using minimal energy. Variable $\Delta_i$ indicates the logic gate's incremental output delay in clock stretcher 200 from the rising clock edge. The inverters 202a-202c and NAND gate 204 are sized in clock stretcher 200 so that their delays satisfy these conditions:

$$\text{width} = MSW \qquad (7)$$
$$\text{width} = (180 - 60)$$
$$\text{ps} = 120 \text{ ps}$$
$$= \Delta_1 + \Delta_2 + \Delta_3$$
$$= t_{1f} + (t_{2r} - t_{2f}) + (t_{3f} - t_{3r})$$
$$\text{offset} = t_{2f} + t_{3r} = 60 \text{ ps} \qquad (8)$$

where $t_{ir}$ ($t_{if}$) is the rising (falling) delay of gate i. For inverters 202a, $t_{1f}$=120 ps. For a NAND gate 204, $t_{2r}$=30 ps is the best case rising delay and $t_{2f}$=30 ps is the worst case falling delay. For inverter 202b, $t_{3f}$=$t_{3r}$=30 ps. As cutoff-cntr-p is just the inversion of cutoff-cntr-n, the maximal delay of inverter 202c, an inverter, is designed to be very small so that cutoff-cntr-p is delayed less than 10% of the width of the timing window, which is 12 ps.

A 10% error was found in the static timing analysis compared with the analog simulator delay. The minimal switching window (MSW) for each gate was doubled to make method 20 very insensitive to circuit delay variations due to various process corners. This allows up to 40% error in the rising and falling edge timings of cutoff control signals, so delayerror= (10%+40%)×2=100%. This greatly reduces the design complexity of the clock stretchers. Analog simulation is used to verify the results to make sure that the cutoff control signals match our timing specifications. High $V_{th}$ transistors should be used for all transistors in the clock stretchers to reduce their leakage power. In one embodiment, the error in the minimal switching window (MSW) width is related to actual clock stretcher design parameters and to process variations.

Block 26 can be implemented using cutoff control generator 110 as shown in FIG. 5. Cutoff control signals 112 are generated by the cutoff control generator 110 using global clock signal 114. Cutoff control signals 112 all have the same period as global clock 114 and are carefully tuned so that they turn on power cutoff pMOS transistor 104 and nMOS transistor 106 only during the switching window of that group 110a-110n within each clock cycle. For a global clock period of 1 GHz with a 50% duty cycle, the waveforms in FIG. 5 show the relationship of the global clock and one pair of cutoff control signals, which control a group whose switching window is (60 ps, 180 ps).

Referring to FIG. 2, in block 27, latches can be added to primary outputs of circuits not having latches for enabling data capture on primary outputs such that the primary outputs do not degrade. A check can be performed on all primary outputs to determine if each of the primary outputs have latches. If the primary outputs have latches already, a check can be performed to confirm that the latch is on all the time. If the primary output does not have a latch, a latch can be added to the primary output. The signal on each primary output (PO) is stored in the latch immediately before the power is turned off of the gate drives that primary output (PO). The output power cutoff control signals of that gate can be used to control the corresponding latch. In an embodiment where each primary output (PO) is usually followed by a flip-flop, the latches can be removed.

In block 28, the circuit determined from blocks 20-27 is simulated using analog simulators and compared with simulations without the modifications of blocks 20-27 for the same test vectors. All primary outputs are checked to determine power saved and that the modified current functions correctly.

In block 29, the power savings of the circuit delivered form blocks 20-27 is analyzed. Method 20 is preferably targeted for reducing active leakage power by turning on each gate only within a small part of the entire clock cycle. Method 20 significantly reduces active leakage power. In one embodiment, method 20 can be used to reduce standby leakage power and dynamic power. When the circuit is in standby mode, standby leakage power can be saved by turning off the power connections of all groups. By turning on the power of a gate only within its switching window, the gate can make transitions only when all of its inputs are ready. This automatically balances the delay differences between the inputs of each gate. Therefore, glitches, which are unnecessary transitions of the output due to different delays on inputs, are automatically eliminated. This results in dynamic power savings.

In method 20, as described above, the width of minimal switching windows (MSWs) can be doubled and the minimal switching windows (MSWs) of some gates combined to reduce the extra cost of implementation of the method. A logic gate will have an output glitch if the path delays for an input transition from a PI to different inputs of the gate differ by an amount greater than the gate inertial delay. Combining minimal switching windows (MSWs) of multiple gates, therefore, introduces glitches. It has been found that circuits which were modified by method 20 have many fewer glitches compared with unmodified circuits, which may result in significant dynamic power savings.

Method 20 was tested on the ISCAS '85 benchmarks in a 70 nm CMOS process modeled by Berkeley Predictive Models. For each benchmark circuit, the circuit without DPCT method 20 and the one with DPCT method 20 were running at the same frequency using the same test vectors. Random test vectors with 0.5 activities were used for all of the PIs. The clock period of the test vectors for each benchmark is chosen to be an integer about 10% larger than the worst-case circuit delay. $V_{DD}$ is set to 1.0 V. The temperature is set to 90° C. to reflect the real chip temperature when the circuit is active. Single low $V_{th}$ MOS transistors were used, where the $V_{th}$ voltages are 0.16 V and –0.19 V for nMOSFETs and pMOS transistors, respectively. All circuits were simulated using Synopsys Nanosim™ to get their detailed power profile. The results are shown in Table 2.

TABLE 2

Power Savings and Area Cost of DPCT on ISCAS '85 Benchmarks

| Circuit | Clock Frequency (Hz) | Total Power | | | Active Leakage Power | | | Dynamic Power | | | Area Cost (%) |
|---|---|---|---|---|---|---|---|---|---|---|---|
| | | Without DPCT (μW) | With DPCT (μW) | Savings (%) | Without DPCT (μW) | With DPCT (μW) | Savings (%) | Without DPCT (μW) | With DPCT (μW) | Savings (%) | |
| c432 | 1 G | 75.06 | 50.44 | 32.8 | 35.76 | 6.93 | 80.6 | 39.30 | 43.51 | −10.7 | 29.1 |
| c499 | 1 G | 179.39 | 111.93 | 37.6 | 100.05 | 21.73 | 78.3 | 79.34 | 90.20 | −13.7 | 12.1 |
| c880 | 1 G | 140.72 | 114.13 | 18.9 | 65.09 | 10.81 | 83.4 | 75.63 | 103.31 | −36.6 | 20.2 |
| c1355 | 1 G | 209.83 | 151.51 | 27.3 | 101.39 | 15.93 | 84.3 | 108.44 | 135.51 | −24.9 | 23.3 |
| c1908 | 800 M | 345.59 | 242.75 | 29.8 | 141.27 | 22.98 | 83.7 | 204.32 | 219.76 | −7.6 | 16.3 |
| c2670 | 625 M | 495.85 | 275.57 | 44.4 | 240.80 | 29.27 | 87.8 | 255.05 | 246.30 | 3.4 | 13.7 |
| c3540 | 500 M | 508.20 | 273.83 | 46.1 | 310.90 | 42.10 | 86.5 | 197.30 | 231.73 | −17.5 | 9.2 |
| c5315 | 625 M | 1064.60 | 625.57 | 41.2 | 509.00 | 88.64 | 82.6 | 555.60 | 536.93 | 3.4 | 6.0 |
| c6288 | 200 M | 837.42 | 237.85 | 71.6 | 453.85 | 59.94 | 86.8 | 383.58 | 177.91 | 53.6 | 13.7 |
| c7552 | 625 M | 1600.42 | 793.69 | 50.4 | 725.21 | 72.95 | 89.9 | 875.20 | 720.74 | 17.7 | 5.2 |
| Average | | 545.71 | 287.73 | 40.1 | 268.33 | 37.13 | 84.4 | 277.38 | 250.59 | 9.7 | 14.9 |

It is shown in Table 2 that method 20 saves up to 90% active leakage power, up to 54% dynamic power, and up to 72% total power. The average active leakage saving is 84.4%, the average dynamic power saving is 9.7%, and the average overall power saving is 40.1%. The power savings of method 20 on bigger circuits are more significant than those on smaller circuits. As operating cutoff transistors introduce extra dynamic power, the dynamic power saving will be negative if the dynamic power saved by reducing glitches is smaller than the extra cost. Accordingly, the dynamic power savings are small or negative on relatively small circuits, but quite significant on larger circuits such as c6288, where glitches are much more significant than in any other benchmark.

When the circuit is in standby mode, standby leakage power can be saved by turning off the power to all groups. The experimental results on ISCAS '85 benchmark circuits show more than 99% average standby leakage power savings.

There are two costs of implementing DPCT, delay and chip area. Similar to conventional power cutoff techniques, DPCT introduces about 6% delay. To minimize the delay, the power cutoff MOSFETs usually are more than 10 times larger than other transistors. Clock stretchers, used to generate cutoff control signals, also add extra chip area. These altogether introduce 15% area overhead, on average. Table 2 shows the area overhead of DPCT on ISCAS '85 benchmarks.

It is to be understood that the above-described embodiments are illustrative of only a few of the many possible specific embodiments, which can represent applications of the principles of the invention. Numerous and varied other arrangements can be readily devised in accordance with these principles by those skilled in the art without departing from the spirit and scope of the invention.

What is claimed is:

1. A method of power cutoff in a circuit having a plurality of gates comprising the steps of:
    (a) determining a minimal switching window for each of said gates in said circuit performed by a computer;
    (b) grouping said gates having overlapping said minimal switching windows into one or more groups performed by a computer;
    (c) inserting a cutoff control device into each of the determined one or more circuit of said groups; and
    (d) generating cutoff control signals for controlling said cutoff control device of each of the determined one or more groups wherein said cutoff control signals turn on a power connection of each said gate controlled by said cutoff control device only within said minimal switching window of said gate during a clock cycle.

2. The method of claim 1 further comprising the step of:
    adding latches to one or more primary outputs of said circuit and using said cutoff control signals to control said latch.

3. The method of claim 1 further comprising the step of:
    simulating said circuit determined by steps (a) through (d) performed by a computer; and
    comparing the simulation of said circuit determined by steps (a) through (d) with said circuit before steps (a) through (d) performed by a computer.

4. The method of claim 1 further comprising the step of:
    analyzing power savings of said circulated determined by steps (a) through (d) performed by a computer.

5. The method of claim 1 wherein said cutoff control signals turn on a power connection of each said gate controlled by said cutoff control device only within said minimal switching window of said gate during a clock cycle.

6. The method of claim 1 wherein said cutoff control signals turn off a power connection of each said gate controlled by said cutoff control device when said circuit is idle.

7. The method of claim 1 wherein said minimal switching window is a timing window from an earliest arrival time of one or more input signals to said gate to a latest arrival of an output signal of said gate.

8. The method of claim 7 wherein said minimal switching window is by $((T_o-D), T_o)$, where $T_o$ is the latest arrival of the signal at the output of the gate and D is the maximal delay of the gate and further comprising the step of:
    using static timing analysis to calculate $T_o$ of each said gate performed by a computer.

9. The method of claim 1 wherein after step (a) further comprising the step of multiplying said minimal switching window by a factor to ensure reliable signals and immunity to process variations.

10. The method of claim 1 wherein step (b) is performed with a greedy partitioning algorithm represented by an optimized function $$OPT = pa \times PA - pb \times COST$$

where PS is the estimated total active leakage power saving percentage and COST is the estimated indication of the total area and speed cost such that;

$$\text{COST} = \sum_{k=1}^{N_{groups}} p\text{cost} \times Width_k / T_{cycle}$$

where $N_{groups}$ is the total number of said groups, $Width_k$ is the width of the minimal switching window of group k, and pcost is the overall cost per group per unit time of the minimal switching window; and $$PS = \sum_{k=1}^{N_{gates}} a \times (T_{cycle} - Width_k) / T_{cycle}$$

where $N_{gates}$ is the total number of gates within this circuit, $Width_k$ is the width of the minimal switching window of the group where the gate k belongs, $T_{cycle}$ is the clock period, and a is a parameter for estimation of leakage power saving.

11. The method of claim 10 wherein said greedy partitioning algorithm is performed by the steps of:
(e) rounding said minimal switching windows into integer units;
(f) sorting said minimal switching windows into increasing order by start time;
(g) determining said optimized function for each of said one or more groups;
(h) calculating said optimized function (OPT) of each group that combines two consecutive said minimal switching windows and comparing with a sum of the two optimized functions (OPT);
(i) recording a larger value for step (h) and the corresponding said group;
(j) increasing by one a number of the combined groups of minimal switching windows; and
repeating steps (g) through (j) until all minimal switching windows are combined.

12. The method of claim 1 wherein in step (d) a clock stretcher is used to generate said control signals.

13. A system of power cutoff in a circuit having a plurality of gates comprising:
a minimal switching window of each said gate in said circuit;
said gates having overlapping said minimal switching windows being grouped into one or more groups;
a cutoff control device being inserted into each of the determined one or more of said circuit groups; and
cutoff control signals being generated for controlling said cutoff control device of each of the determined one or more groups wherein said cutoff control signals turn on a power connection of each said gate controlled by said cutoff control device only within said minimal switching window of said gate during a clock cycle.

14. The system of claim 13 wherein said cutoff control device is a pMOS transistor and an nMOS transistor inserted into each of said one or more groups to control $V_{DD}$ signals and GND signals of said gates of said respective one or more groups.

15. The system of claim 13 wherein said cutoff control signals comprises a clock stretcher.

16. The system of claim 13 further comprising one or more latches added to one or more primary outputs of said circuit and using said cutoff control signals to control said one or more latches.

17. The system of claim 13 wherein said cutoff control signals turn on a power connection of each said gate controlled by said cutoff control device only within said minimal switching window of said gate during a clock cycle.

18. The system of claim 13 wherein said cutoff control signals turn off a power connection of each said gate controlled by said cutoff control device when said circuit is idle.

19. The system of claim 13 wherein said minimal switching window is a timing window from an earliest arrival time of one or more input signals to said gate to a latest arrival of an output signal of said gate.

20. The system of claim 19 wherein said minimal switching window is by $((T_o-D), T_o)$, where $T_o$ is the latest arrival of the signal at the output of the gate and D is the maximal delay of the gate and static timing analysis is used to calculate $T_o$ of each said gate.

21. The system of claim 13 wherein said minimal switching window is multiplied by a factor to ensure reliable signals and immunity to process variations.

22. The system of claim 13 wherein said means for grouping said gate is performed with a greedy partitioning algorithm represented by an optimized function $OPT=pa \times PA - pb \times \text{COST}$ where PS is the estimated total active leakage power saving percentage and COST is the estimated indication of the total area and speed cost such that;

$$\text{COST} = \sum_{k=1}^{N_{groups}} p\text{cost} \times Width_k / T_{cycle}$$

where $N_{groups}$ is the total number of said groups, $Width_k$ is the width of the minimal switching window of group k, and pcost is the overall cost per group per unit time of the minimal switching window; and $$PS = \sum_{k=1}^{N_{gates}} a \times (T_{cycle} - Width_k) / T_{cycle}$$

where $N_{gates}$ is the total number of gates within this circuit, $Width_k$ is the width of the minimal switching window of the group where the gate k belongs, $T_{cycle}$ is the clock period, and a is a parameter for estimation of leakage power saving.

* * * * *